US010451695B2

(12) United States Patent
Suematsu et al.

(10) Patent No.: US 10,451,695 B2
(45) Date of Patent: Oct. 22, 2019

(54) SYSTEM AND METHOD FOR PROCESSING NMR SIGNALS

(71) Applicant: JEOL Ltd., Tokyo (JP)

(72) Inventors: Takako Suematsu, Tokyo (JP); Hiroaki Utsumi, Tokyo (JP); Tomoki Nakao, Tokyo (JP); Toshihiro Furukawa, Kawasaki (JP)

(73) Assignee: JEOL Ltd., Tokyo (JP)

( * ) Notice: Subject to any disclaimer, the term of this patent is extended or adjusted under 35 U.S.C. 154(b) by 1393 days.

(21) Appl. No.: 14/458,507

(22) Filed: Aug. 13, 2014

(65) Prior Publication Data

US 2015/0057979 A1 Feb. 26, 2015

(30) Foreign Application Priority Data

Aug. 26, 2013 (JP) .................................. 2013-174931

(51) Int. Cl.
*G01R 33/46* (2006.01)
*G01R 33/36* (2006.01)

(52) U.S. Cl.
CPC ...... *G01R 33/4625* (2013.01); *G01R 33/3621* (2013.01)

(58) Field of Classification Search
CPC ..................................................... G01R 33/46
See application file for complete search history.

(56) References Cited

U.S. PATENT DOCUMENTS

| 2004/0239323 A1* | 12/2004 | Taylor | ............... | G01R 33/4625 324/307 |
| 2008/0150525 A1* | 6/2008 | Song | .................... | G01N 24/08 324/307 |
| 2011/0204892 A1* | 8/2011 | Li | ......................... | G01N 24/081 324/309 |
| 2014/0064586 A1* | 3/2014 | Peacock | ........... | G01R 33/4625 382/131 |

(Continued)

OTHER PUBLICATIONS

P. Koehl, "Linear prediction spectral analysis of NMR data", Progress in Nuclear Magnetic Resonance Spectroscopy, 1999, pp. 257-299, 34.

*Primary Examiner* — Evren Seven
(74) *Attorney, Agent, or Firm* — The Webb Law Firm

(57) ABSTRACT

There is disclosed an NMR signal processing method for accurately estimating the intensities of p peaks of interest in an NMR spectrum by the use of a mathematical model that represents a time-domain, free induction decay (FID) signal obtained by an NMR measurement as a sum of q signal components. First, q parameters (each being a combination of a pole and a complex intensity) defining q signal components are estimated for each value of the estimation order q of the mathematical model while varying the value of the estimation order q (S34). At each value of the estimation order q, p parameters are selected from the q parameters in accordance with selection criteria (S42, S46). The selected p parameters are evaluated (S48). An optimal value of the estimation order is determined based on the evaluation values produced at the various values of the estimation order (Continued)

q, and p parameters corresponding to the optimal value of the estimation order is identified. The intensities of p peaks of interest are found from the identified p parameters.

9 Claims, 10 Drawing Sheets

(56) References Cited

U.S. PATENT DOCUMENTS

| | | | | |
|---|---|---|---|---|
| 2015/0077104 A1* | 3/2015 | Diehl | ............... | C07F 9/094 |
| | | | | 324/307 |
| 2016/0223632 A1* | 8/2016 | Baek | ............... | G01R 33/4625 |
| 2016/0327626 A1* | 11/2016 | Ha | ............... | G01R 33/46 |
| 2017/0011255 A1* | 1/2017 | Kaditz | ............... | G01R 33/48 |
| 2017/0108454 A1* | 4/2017 | Fischer | ............... | G01R 33/4625 |

* cited by examiner

SYSTEM AND METHOD FOR PROCESSING NMR SIGNALS

BACKGROUND OF THE INVENTION

Field of the Invention

The present invention relates to a system and method for processing NMR (nuclear magnetic resonance) signals and, more particularly, to a system and method for estimating plural signal components contained in an NMR signal by the use of a mathematical model.

Description of Related Art

Nuclear magnetic resonance spectroscopy generally involves detecting a free induction decay (FID) signal emanating as an NMR signal from nuclei under observation within a compound, Fourier transforming the detected FID signal, and creating an NMR spectrum. Based on the spectrum, the molecular structure of the compound is analyzed. In recent years, a system for making a quantitative analysis by utilizing NMR has been put into practical use. This technique is known as quantitative NMR (qNMR). In qNMR, the amount or concentration of a certain substance contained in a sample is found from the intensity (signal intensity) of a peak of interest within a spectrum to be analyzed. Therefore, it is quite important to accurately find the intensity in qNMR. The following methods have been heretofore known as methods of finding intensities. Generally, in qNMR, subjects whose qualitative nature is known to some extent are analyzed and so information about the number and positions of peaks appearing in an NMR spectrum used for analysis is known.

A first method is known as the integration method. In this method, a frequency range containing a peak of interest is set in a spectrum. Integration is performed within this frequency range to find the intensity of the peak of interest. This intensity is equivalent to the area occupied by the waveform of the peak of interest. In this method, it is difficult to determine the integral range. There is the problem that the computed intensity varies depending on the integral range. Furthermore, there is the problem that, if plural peaks overlap with each other, it is difficult to find intensities precisely.

A second method is a waveform separation method (especially, a curve fitting method). In this method, in approximating or simulating a peak of interest in a spectrum, an optimal value of a parameter (e.g., intensity, linewidth, or frequency) defining the waveform is searched for. In this method, however, depending on the spectral waveform, it is observed that there is a tendency that computational results depend on the initial value of the parameter. That is, if the initial value is different, different computational results will occur.

A third method consists of introducing a mathematical model representing a time-domain FID signal and estimating a numerical value or a string of numerical values that gives a parameter value contained in the mathematical model. The Prony method is known as one type of this method (see F. Malz, H. Jancke: J. Pharm. Biomed. Anal., 38, 813 (2005)). In this Prony method, it is assumed that an FID signal is composed of plural signal components. The content of a parameter defining each signal component is estimated. Each individual signal component corresponds to one peak in a spectrum. In practice, however, a spectrum contains various components. Furthermore, a spectral waveform is affected by various kinds of processing performed on the FID signal. Accordingly, it has been proposed to apply the Prony method while assuming more signals components than the peaks of interest in the spectrum. This is known as the high-order estimation method (see Santosh Kumar Bharti, Raja Roy; TrAC, 35, 5 (2012)). The use of this method makes it possible to avoid the problem associated with setting of the integral range, the problem being pointed out regarding the first method. In addition, the problem of the dependence on an initial value as pointed out regarding the second method can be avoided. Therefore, it can be definitely said that this third method is a more objective method than the first and second methods.

In the above-described third method, however, estimation results depend on the number of assumed signal components (order). It can be pointed out that there is the problem that if the number of assumed signal components cannot be determined correctly, the estimation accuracy will deteriorate.

SUMMARY OF THE INVENTION

It is an object of the present invention to provide a technique for accurately finding intensities of peaks of interest in an NMR spectrum. It is a more specific object of the invention to provide a technique for accurately finding parameters corresponding to peaks of interest by giving an appropriate estimation order to a mathematical model that represents an FID signal from which an NMR spectrum is created.

An NMR signal processing system associated with the present invention has: estimation means for obtaining estimation results by applying a mathematical model, which represents an FID (free induction decay) signal as a sum of q signal components, to the FID signal obtained by an NMR measurement and producing the estimation results including q estimated parameters defining the q signal components, the estimation means being operative to obtain the estimation results by providing estimates at different values of q while varying the value of q; evaluation means for evaluating the estimation results produced by the estimation means for each value of q; and decision means for determining an optimal value of q based on the evaluation results produced by the evaluation means for each value of q to thereby identify plural parameters corresponding to the optimal value of q from among the estimation results produced by the estimation means.

According to the above-described configuration, an optimal order (optimal estimation order) can be determined by varying the estimation order q of the mathematical model (i.e., the number of signal components) in a trial-and-error manner, obtaining estimation results based on actual signals at each value of q, and evaluating the estimation results. Consequently, it is possible to solve the problem that estimates depending on the estimation order tend to induce increased estimation errors. In other words, the estimation order that is set in practice and employed according to an FID signal can be optimized. From this respect, the present technique can be referred to as an estimation order optimization method.

In the above-described configuration, during the process for searching for an optimal order, plural parameters are estimated at each value of order q and, therefore, when the optimal order is determined, any recalculation for estimation is not needed fundamentally. The requirement is only to identify the plural parameters corresponding to the optimal order from among the estimation results already computed. Of course, recomputations for estimations are possible. In a mathematical model, order q generally indicates that an NMR signal is simulated with q signal components. In a mathematical model, each signal component is defined by a parameter, which in turn is composed of one or more variables. In embodiments described later, a parameter is a combination of a pole and a complex intensity. Usually, q is 1, 2, 3, or other positive integer.

The FID signal may be processed prior to the computations for estimations. Preferably, the mathematical model is a mathematical formula representing a time-domain FID signal in terms of a sum of plural exponentially attenuating sinusoidal waves. The variable range of the order q is specified by a user or automatically set. The sequence of values that the order q assumes may be so determined that the optimal order can be efficiently searched for. In this case, estimation and evaluation may be performed simultaneously. Fundamentally, q parameters are estimated for each value of the order q, with the exception that some parameters are omitted from being estimated. In evaluating estimation results, actual signals are preferably referenced.

Preferably, the NMR signal processing system includes selection means for selecting plural parameters subjected to evaluation from among the q parameters estimated by the estimation means for each value of q in accordance with selection criteria determined according to p peaks of interest in the frequency domain. The evaluation means determines the optimal order by calculating an evaluation value for each value of the order q based on the results of the selection made by the selection means. The decision means determines an optimal evaluation value from among the evaluation values calculated for the various values of the order q by the evaluation means.

According to this configuration, not all of the q parameters estimated for each value of the order q are subjected to evaluation. Rather, only plural parameters satisfying the selection criteria can be subjected to evaluation. That is, only parameters which are highly likely to match the p peaks can be subjected to evaluation. This can enhance the evaluation accuracy. Hence, the present technique can be referred to as a selective evaluation method. Note that p is an integer that is equal to or greater than 1. Preferably, the variable range of q is between p and a maximum value, $q_{max}$, of the order q.

Preferably, the decision means identifies only p parameters (i.e., selected parameters) matching p peaks rather than all the parameters from among parameters whose number corresponds to the optimal order, if this optimal order is determined. Consequently, only parameters corresponding to a noise waveform can be discarded from the parameters estimated under the condition of the optimal order, and only parameters corresponding, for example, to true peaks can be extracted. As a consequence, an estimation matching the purpose can be accomplished, and the estimation accuracy can be enhanced. Thus, the present technique can be referred to as a selective estimation method.

Preferably, the selection means has a function of selecting p parameters subjected to evaluation for each value of the order q from among the q parameters estimated by the estimation means. The evaluation means has a function of calculating an evaluation value for each value of the order q, based on the p parameters selected by the selection means. That is, fundamentally, in a high-order estimation method, q parameters are estimated for each value of the order q that is equal to or greater than p, and p parameters are selected from the q estimated parameters. As a result of the selection, parameters whose number is less than p may be selected in an exceptional manner. In this case, these selected parameters may or may not be subjected to evaluation.

Preferably, the selection criteria include a first set of selection criteria for selecting parameters for each value of the order q by making use of a selected area containing the p peaks of interest. The selection means includes first selection means for selecting plural parameters satisfying the first set of selection criteria from among the q parameters estimated by the estimation means. According to this configuration, a decision is made as to whether each individual parameter is good or bad, from a viewpoint of frequency. Only good parameters that are highly likely to correspond to the peaks of interest can be left.

Preferably, the selection criteria include a second set of selection criteria for selecting the most significant p parameters which are most likely to be true peaks. The selection means includes second selection means for selecting the most significant p parameters in accordance with the second set of selection criteria from among the plural parameters satisfying the first set of selection criteria selected by the first selection means. According to this configuration, a required number of parameters which are highly likely to represent peaks of interest according to the result of a comparative assessment can be carefully selected from the parameters left behind by the first selecting step. Preferably, the second set of selection criteria is associated with a physical quantity different from frequency (e.g., linewidth, intensity, or shape).

Preferably, the lower limit of the variable range of the order q is p and the upper limit of the variable range of the order q is set based on p. It is desired to set the variable range such that an optimal order is contained in the variable range of the order q. Since it can be said that the optimal order is equal to or greater than the number of peaks p of interest, the lower limit of the variable range is set to p. The upper limit of the variable range may be set, for example, by multiplying p by a coefficient m.

Preferably, the evaluation means calculates an evaluation value by comparing the actual signal against a synthesized signal which is generated by giving the estimated parameters to the mathematical model. According to this configuration, the waveform of the actual waveform is compared against the waveform of an estimated signal. An evaluation value is calculated from a degree of coincidence or a degree of dissimilarity. Instead of evaluation in the time domain, evaluation in the frequency domain can be made, for example, by comparison of spectral waveforms. In the latter case, a frequency range to be evaluated may be set in the frequency domain.

Preferably, the system includes filtering means for subjecting the actual signal to bandpass filtering for pretreating it. The estimation means estimates the plural parameters based on the bandpass-filtered actual signal. According to this configuration, frequency components which are made unnecessary by signal processing can be filtered out or suppressed in advance. Consequently, the amount of calculation can be reduced or the estimation accuracy can be enhanced.

A computer program associated with the present invention is on a computer readable storage for use in a computer having an operating system and operated in an NMR signal processing system, the computer program comprising code for implementing the functions of: preparing a mathematical model that represents a free induction decay (FID) signal obtained by an NMR measurement as a sum of q signal components; applying the mathematical model to the FID signal to obtain estimation results including q estimated parameters defining the q signal components; varying the value of q, providing estimates at different values of q, producing estimation results, and storing the estimation results in a first storage portion; evaluating the estimation results stored in the first storage portion and obtained for each value of q and storing evaluation results obtained for each value of q in a second storage portion; and determining an optimal value of q based on the evaluation results obtained for each value of q and stored in the second storage portion to thereby identify plural parameters corresponding to the optimal value of q from among the estimation results stored in the first storage portion.

Preferably, the computer program is stored on a storage medium such as a CD-ROM and installed in an NMR signal processing system via the storage medium. Of course, the program may be installed via a network.

According to the present invention, the intensities of peaks of interest in an NMR spectrum can be found accurately. More specifically, according to the present invention, parameters corresponding to peaks of interest can be found accurately by giving an appropriate estimation order to a mathematical model that represents an FID signal from which an NMR spectrum is created.

DESCRIPTION OF THE INVENTION

Figure 1:
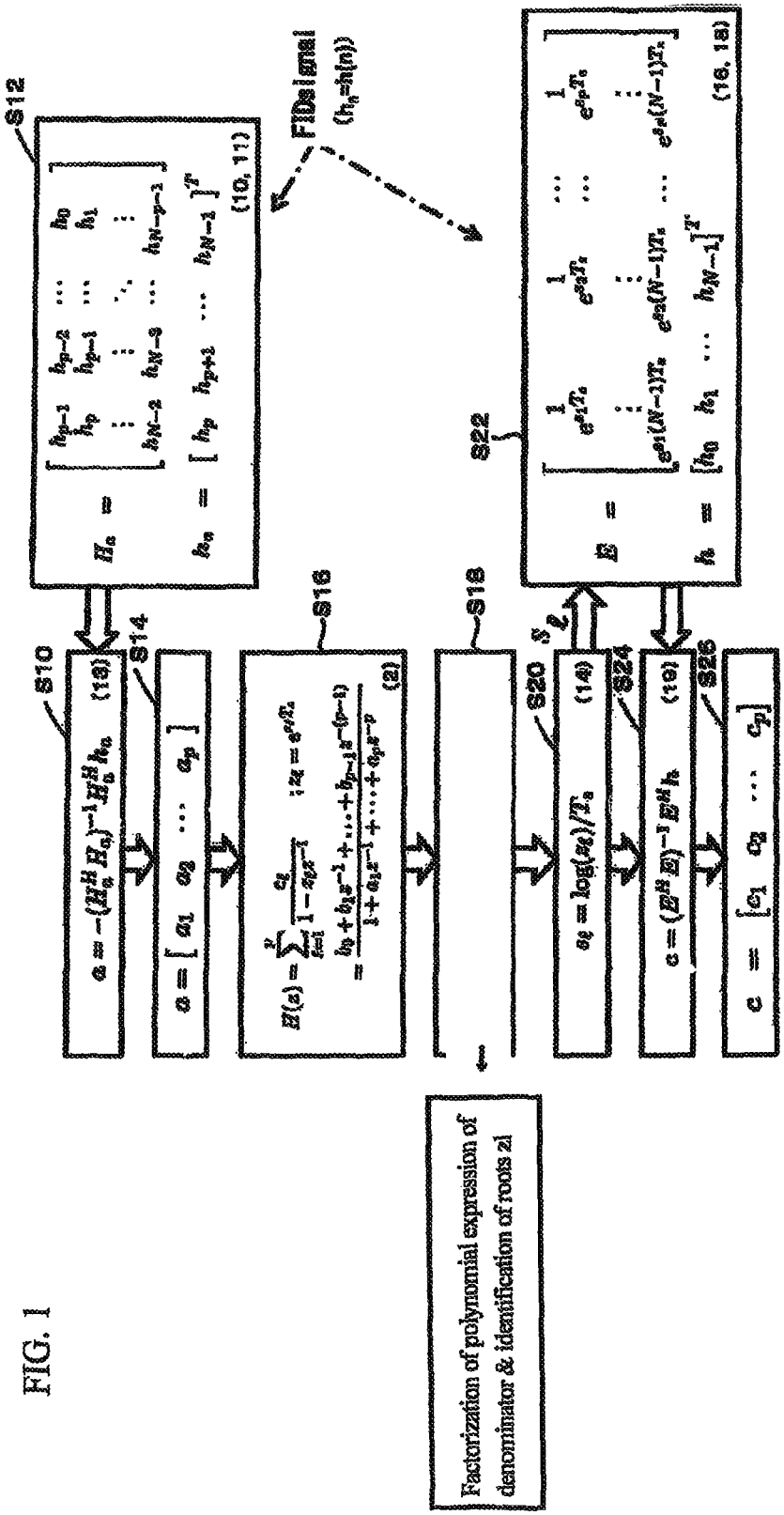
FIG. 1 is a conceptual diagram illustrating an intensity estimating method based on the conventional Prony method.

The preferred embodiments of the present invention are hereinafter described. A fundamental explanation of a model of a free induction decay (FID) signal will be first provided. Then, method and system associated with one embodiment of the invention will be described in further detail.

(1) FID Signal Model

A time-domain FID signal obtained by an NMR measurement can be represented as a linear combination of a plurality of exponentially decaying sinusoidal waves (i.e., plural signal components) as given below.

$$h(n) = \sum_{l=1}^{p} c_l e^{n s_l T_s}; \quad (1)$$

$$c_l = C_l e^{j\varphi_l}, s_l = -\sigma_l + j\omega_l$$

where $T_s$ is a sampling interval, h(n) is a sample value of the FID signal at instant t (=n $T_s$) (where n=0, 1, 2, 3, and so forth), and p indicates the number of signal components constituting the FID signal. In the following description, p is referred to as the "constitution order". $C_l$, $\varphi_l$, $\sigma_l$ and $\omega_l$ are the intensity, phase, linewidth (half width at half maximum), and resonance frequency, respectively, of the FID signal. These are identified for each individual signal component. The subscript l is a variable identifying each signal component and can assume values of 1, 2, . . . , p. $C_l$ and $s_l$ are referred to as the complex intensity and pole, respectively, of the FID signal. The pole is also a complex number. For each signal component, there exists a combination of a complex intensity and a pole, which will be referred to as "parameters" later. A value to be found ultimately is the intensity included in Eq. (1) and given by $C_l$. That is, it is the intensity of each signal component. This corresponds to the intensity of each peak in an NMR spectrum. For computational convenience, a z transform that is a mathematical operation on a discrete function is applied to Eq. (1). This results in Eq. (2) (see Arnab K. Shaw, Krishna Naishadham: "ARMA-Based Time-Signature Estimator for Analyzing Resonant Structures by the FDTD Method", IEEE Antennas and Propagation Society, 49, 327 (2001)).

$$H(z) = \sum_{l=1}^{p} \frac{C_l}{1-z_l z^{-1}}; z_l = e^{s_l T_s} \quad (2)$$

$$= \frac{b_0 + b_1 z^{-1} + \ldots + b_{p-1} z^{-(p-1)}}{1 + a_1 z^{-1} + \ldots + a_p z^{-p}}$$

where $z^{-1}$ is a delay operator. $a_l$ and $b_l$ are a series of AR coefficients and a series of MA coefficients, respectively. The right hand of Eq. (2) is known as an autoregressive moving average (ARMA) model.

$$z = z_l = e^{s_l T_s}$$

is equivalent to the pole in the function H(z) of Eq. (2).

The Prony method described below is known as a technique for finding the intensity of each signal component after the pole and complex intensity of each signal component constituting an FID signal are estimated based on Eqs. (1) and (2) (see Parks, T. W., C. S. Burrus.: Digital Filter Design (Topics and Digital Signal Processing), p. 226 (1987), (Wiley-Interscience)).

(2) Prony Method

The z transform of h(n) of Eq. (1) representing an FID signal can also be represented as given by Eq. (3).

$$H(z) = h_0 + h_1 z^{-1} + \ldots + h_{N-1} z^{-(N-1)} + \ldots \quad (3)$$

$$= \sum_{n=0}^{\infty} h_n z^{-n}$$

where N is the number of data points. In the following description, it is assumed that $h_n = h(n)$.

The right side of Eq. (2) and the right side of Eq. (3) lead to:

$$(1 + a_1 z^{-1} + \ldots + a_p z^{-p}) \left( \sum_{n=0}^{\infty} h_n z^{-n} \right) = b_0 + b_1 z^{-1} + \ldots + b_{p-1} z^{-(p-1)} \quad (4)$$

Expanding the left side of Eq. (4) and comparing the coefficients of $z^{-n}$ of both sides results in $$Ha = -\tilde{h} \quad (5)$$

where H, a, and $\tilde{h}$ are respectively given by:

$$H = \begin{bmatrix} H_a \\ H_b \end{bmatrix} \quad (6)$$

$$= \begin{bmatrix} h_0 & 0 & \cdots & 0 \\ h_1 & h_0 & \cdots & 0 \\ \vdots & \vdots & \ddots & 0 \\ h_{p-1} & h_{p-2} & \cdots & h_0 \\ \vdots & \vdots & \ddots & \cdots \\ h_{N-2} & h_{N-3} & \cdots & n_{N-p-1} \end{bmatrix}$$

$$a = [a_1 \ a_2 \ \ldots \ a_p]^T \quad (7)$$

$$\tilde{h} = [h_b^T \ h_a^T] \quad (8)$$
$$= [h_1 - b_1 \ h_2 - b_2 \ \ldots \ h_p \ \ldots \ h_{N-1}]^T$$

where T indicates a transpose and H indicates a Hermitian transpose. It is desired to find a series of coefficients of the polynomial expression of the denominator of Eq. (2) based on Eq. (5), the series of coefficients being given by $a_l$ (l=1, 2, . . . , p). As can be seen from Eqs. (6)-(8), a series of coefficients, $b_l$ (l=1, 2, . . . , p-1), of the polynomial expression of the numerator of Eq. (2) that is needed to find a series of coefficients a from Eq. (5) is unknown. Accordingly, Eq. (9) is solved based on the fact that a satisfying $$H_a a = -h_a \quad (9)$$

is a prerequisite for a satisfying Eq. (5). Note that $H_a$ and $h_a$ are respectively given by $$H_a = \begin{bmatrix} h_{p-1} & h_{p-2} & \cdots & h_0 \\ h_p & h_{p-1} & \cdots & h_1 \\ \vdots & \vdots & \ddots & \vdots \\ h_{N-2} & h_{N-3} & \cdots & n_{N-p-1} \end{bmatrix} \quad (10)$$

$$h_a = [h_p \ h_{p+1} \ \ldots \ h_{N-1}]^T \quad (11)$$

It is assumed that the normality of the rows of $H_a$ holds. This assumption does not always hold generally. However, experimental results described later can support this assumption. In S. Haykin, Hiroshi Suzuki: "Theory of Adaptive Filter (in Japanese)", p. 912 (2001), (Kagaku Gijutsu Shuppan, Japan), discussions are made based on a similar postulation. According to the above-described assumption, Eq. (9) is equivalent to $$H_a^H H_a a = -H_a^H h_a \quad (12)$$

Therefore, the series of coefficients is given by $$a = -(H_a^H H_a)^{-1} H_a^H h_a \quad (13)$$

The polynomial expression of the denominator of Eq. (2) is identified from the series of coefficients a obtained by Eq. (13) above. The root of each signal component, $z_l$, is found by factorizing the polynomial expression of the denominator. Thus, based on Eq. (2), the pole of each signal component is found as given by $$s_l = \log(z_l)/T_s \quad (14)$$

On the other hand, the complex intensity, $c_l$, of each signal component constituting an FID signal can be estimated by substituting the pole, $s_l$, of each signal component obtained using Eq. (14) and solving simultaneous polynomial equations corresponding to n=0, 1, N-1. When computations of their complex intensities are expressed in matrix notation, we have $$Ec = h \quad (15)$$

where E, c, and h are respectively given by $$E = \begin{bmatrix} 1 & 1 & \cdots & 1 \\ e^{s_1 T_s} & e^{s_2 T_s} & \cdots & e^{s_p T_s} \\ \vdots & \vdots & & \vdots \\ e^{s_1 (N-1)T_s} & e^{s_2 (N-1)T_s} & \cdots & e^{s_p (N-1)T_s} \end{bmatrix} \quad (16)$$

$$c = [c_1 \ c_2 \ \ldots \ c_p]^T \quad (17)$$

$$h = [h_0 \ h_1 \ \ldots \ h_{N-1}]^T \quad (18)$$

The pole, $s_l$, is assumed to have no multipole. That is, it is assumed that the following inequality holds:

$$s_i \neq s_j (i \neq j)$$

Therefore, the rows of E of Eq. (16) are regular and c of Eq. (15) is given by $$c = (E^H E)^{-1} E^H h \quad (19)$$

The intensity $C_l$ is the absolute value of the complex intensity, $c_l$. That is, the intensity of each signal component is estimated as given by: $C_l = |c_l|$.

A method of estimating intensities based on the Prony method described so far is conceptually shown in FIG. 1.

At step S10, Eq. (13) is calculated, and a series of coefficients, a, shown at step S14, is identified as computational results. $H_a$ and $h_a$ within Eq. (13) are identified by Eqs. (10) and (11), respectively, as shown at step S12. That is, their matrices can be built as a row or rows of time-domain amplitude values of an FID signal. In an intensity estimation method based on the high-order Prony method described later, a technique that is fundamentally the same as the technique shown in FIG. 1 is applied although the order is different. In this case, FID signals obtained by actual measurements are given to the matrices of Eqs. (10) and (11).

It is possible to identify p roots regarding a function H (z) by giving the series of coefficients, a, to the polynomial expression of the denominator of the right side of Eq. (2) at step S16 and factorizing the polynomial expression of the denominator at step S18. At step S20, p poles are identified from the p roots, based on Eq. (14). At step S24, Eq. (19) is calculated. E and h contained in it are identified by Eqs. (16) and (18) as shown at step S22. E is identified by the poles calculated at step S20. h is defined by an FID signal. Computation of Eq. (19) leads to identification of the complex intensity c of each signal component as shown at step S26. The intensity of each signal component, C, is found as the absolute value of the complex intensity c of each signal component. Each intensity C is the intensity of each peak in an NMR spectrum. The peaks can be quantified by estimating the intensities of the peaks.

(3) High-Order Prony Method

In practice, an FID signal produced by an actual measurement is affected by noises and measurement errors and represented by a modification of Eq. (1), i.e., the following Eq. (20).

$$\tilde{h}(n) = h(n) + v(n) \quad (20)$$

where v(n) is additive white noise and $\bar{h}(n)$ is the subject of analysis, i.e., an FID signal obtained by an actual measurement. This is distinguished from an ideal signal, i.e., a purely mathematical representation, which is given by h(n). If based on Eq. (20) above, Eqs. (1) and (2) do not agree with an FID signal produced by an actual measurement and so it is impossible to estimate the accurate intensity, $C_l$.

Accordingly, the high-order Prony method has been proposed (see Takayoshi Nakamizo, "Signal Analysis and System Identification (in Japanese)", p. 198 (1988), CORONA PUBLISHING CO., LTD, Japan). This technique defines an FID signal model in terms of signal components whose number q is greater than the constitution order p (i.e., q>p). In particular, an FID signal produced by an actual measurement is given as follows.

$$\hat{H}(z) = \frac{\hat{b}_0 + \hat{b}_1 z^{-1} + \ldots + \hat{b}_{q-1} z^{-(q-1)}}{1 + \hat{a}_1 z^{-1} + \ldots + \hat{a}_q z^{-q}} \quad (21)$$

This equation corresponds to Eq. (2) of the Prony method. $\hat{H}(z)$ given by Eq. (21) is referred to as an "estimation model" and q is referred to as the "estimation order". The constitution order p corresponds to the number of peaks of interest in an NMR spectrum. The estimation order corresponds to the number of peaks including noises in an NMR spectrum. Eq. (21) holds based on the assumption that an FID signal represented by the actual time is given by $$\hat{h}(n) = \sum_{k=1}^{q} \hat{c}_k e^{n\hat{s}_k T_s}; \quad (22)$$

$$\hat{c}_k = \hat{C}_k e^{j\hat{\phi}_k}, \hat{s}_k = -\hat{\sigma}_k + j\hat{\omega}_k$$

This Eq. (22) corresponds to the above-described Eq. (1).

This high-order Prony method estimates the pole and intensity of an FID signal, based on Eqs. (21) and (22). This method of estimation based on the high-order Prony method is similar to the estimation in the Prony method except that the order is enhanced. That is, fundamentally, the pole and complex intensity are estimated for each signal component constituting an FID signal by the process illustrated in FIG. 1.

(4) Problems with High-Order Prony Method

Figure 2:
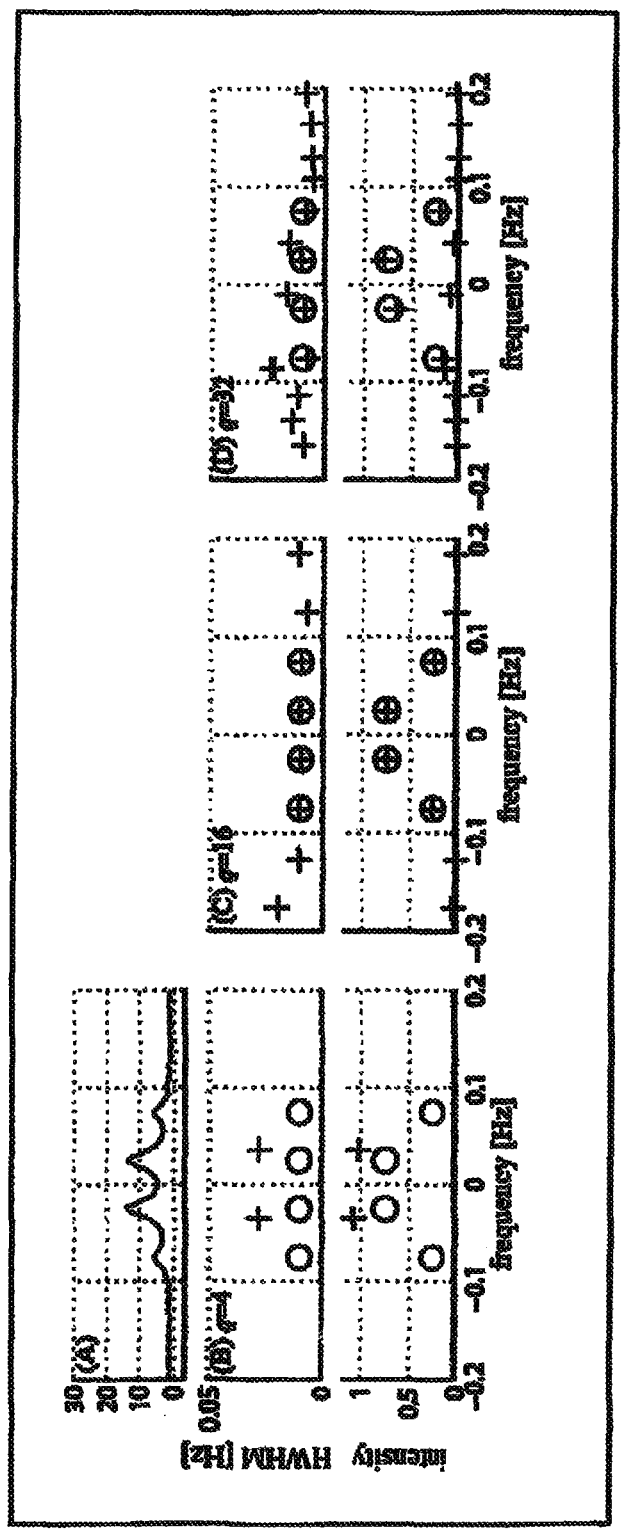
FIG. 2 is a diagram illustrating the problems with the conventional high-order Prony method.

FIG. 2 shows the results of application of the high-order Prony method to a pseudo-FID signal having a constitution order p of 4. A spectrum of the pseudo-FID signal is shown in the upper portion (A). This spectrum contains four peaks of interest. The poles of the peaks are shown as estimation results in the middle portion. The vertical axis indicates linewidth (half width at half maximum). The intensities of the peaks are shown as estimation results in the lower portion. In each of the middle and lower portions, the left portion (B) shows estimation results when the estimation order q is 4 (=p). The central portion (C) shows estimation results when the estimation order q is 16. The right portion (D) shows estimation results when the estimation order q is 32. In each portion, the horizontal axis indicates frequency. Each circular symbol ○ indicates a true value. Each symbol + indicates an estimated value. Some estimated values lying far outside the range where true values are present are omitted from being shown.

As shown in the left portion (B), when the estimation order q is the same as the constitution order p, satisfactory estimation results are not obtained due to the effects of noise components in the observed signal. On the other hand, as shown in the central portion (C), when q is set to 16, i.e., the estimation order q is 4 times as large as the constitution order p, there exist 4 estimated values above or near four true values. If only this area is noticed, the estimation accuracy is considerably improved over the estimation results of the case where q is 4.

On the other hand, as shown in the right portion (D), when q is 32 (i.e., the estimation order q is 8 times as large as the constitution order p), the estimation accuracy is, on the contrary, deteriorated. That is, the estimation accuracy is better than where q is 4 but is lower than where q is 16. It is estimated that the estimated accuracy will rather be deteriorated because an FID signal is approximated with an excessive number of signal components. In the present example, the best estimation results have been obtained when q is 16. Similar recognitions have been shown in S. Braun, Y. M. Ram; "Determination of structural modes via the Prony model: System order and noise induced poles" J. Acoust. Soc. Arm., 81, 1447 (1987) and Takayoshi Nakamizo, "Signal Analysis and System Identification (in Japanese)", p. 198 (1988), CORONA PUBLISHING CO., LTD, Japan. Especially, Takayoshi Nakamizo, "Signal Analysis and System Identification (in Japanese)", p. 198 (1988), CORONA PUBLISHING CO., LTD, Japan reports that the parameter estimating accuracy depends on the magnitude of the estimation order q.

As described so far, according to a high-order Prony method, poles and intensities can be estimated quite accurately as long as the estimation order q is set precisely. However, if the estimation order q cannot be set precisely, there is the danger that the estimation accuracy will deteriorate greatly. It is difficult to uniquely identify the estimation order q in advance because it is considered that the optimal estimation order q can vary depending on the mode of an FID signal which is obtained by an actual measurement and which is to be analyzed or on how the signal behaves. Accordingly, it is necessary to search for and identify an estimation order that gives results closest to results yielded by a true value, i.e., an optimal estimation order.

(5) Method Associated with the Present Embodiment

In the method associated with the present embodiment, a Select Reconstitution Evaluation (SRE) method is applied to a high-order Prony method. When some characteristic items included in the present method are noticed, the present method may also be referred to as estimation order optimization method, select evaluation method, or select estimation method.

Figure 3:
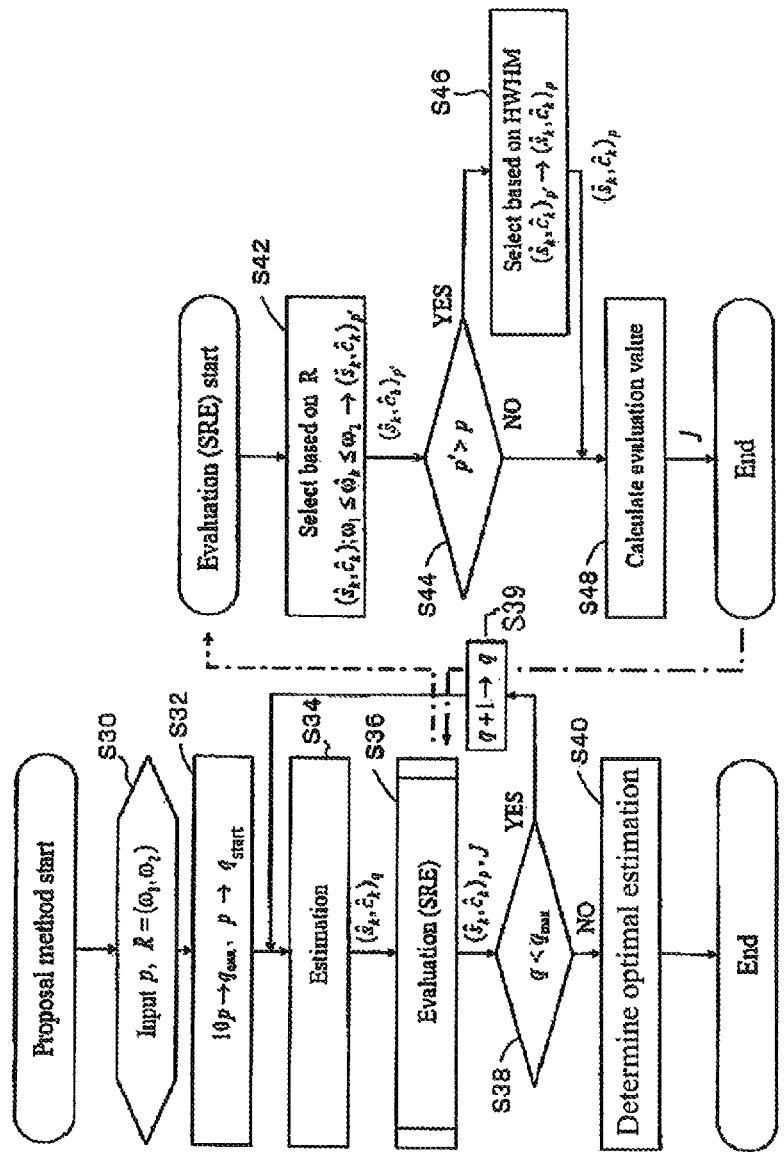
FIG. 3 is a flowchart illustrating a preferred embodiment of the parameter estimation method of the present invention.

The present method is now described in detail by referring to the flowchart of FIG. 3. A main routine is shown in the left half of FIG. 3. A subroutine is shown in the right half. In the following description, for the sake of convenience, a set of a pole and a complex intensity of each signal component constituting an estimation model of Eqs. (21) and (22) is given by ($\hat{s}$, $\hat{c}$). This set is referred to as a parameter. In the course of varying the estimation order q from its initial value to its maximum value $q_{max}$, q parameters are estimated for each value of the estimation order q.

Referring to FIG. 3, S30 is a step for entering initial conditions. That is, constitution order p and selection region R ($\omega_1$, $\omega_2$) are set. The constitution order p corresponds to the number of peaks of interest in an NMR spectrum. For example, the peaks of interest are a plurality of closely spaced peaks corresponding to an atomic group of interest (e.g., a salt of interest). Note that there may be only one peak of interest. The selection region R is a frequency range including peaks of interest. In qNMR, ($\omega_1$ and $\omega_2$ correspond to the lower and upper limits, respectively, of the selection region R. The peaks of interest and selection region R will be described later. In qNMR, subjects whose qualitative nature is already known to some extent are analyzed. Therefore, information about the number of peaks and frequencies in an NMR spectrum used for analysis is known. Consequently, p, $\omega_1$, and $\omega_2$ can be given from the molecular structure of the compound to be analyzed quantitatively.

S32 is a step for setting the initial conditions. In particular, an initial value and a maximum value $q_{max}$ are specified within a variable range of the estimation order q. In the illustrated example, the constitution order p is specified as an initial value $q_{start}$ because it is conceivable that the signal components will be greater in number than the peaks of interest. For example, 10p that is 10 times the constitution order p is specified as the maximum value $q_{max}$. A magnification m may be specified by a user. Alternatively, the magnification m may be automatically specified based on various conditions. In any case, it is desirable to set the variable range to assure that an optimal estimation order to be searched for is contained.

At S34, a parameter string consisting of q parameters is estimated for each value of the estimation order q based on the above-described high-order Prony method. The process of estimating parameters in the high-order Prony method is fundamentally identical to the parameter estimating process based on the Prony method except for order (see FIG. 1). In FIG. 3, a parameter string consisting of q estimated parameters is expressed as follows. For each value of the estimated order q, k assumes an integral value from 1 to q.

$$(\hat{s},\hat{c})_q$$

S36 is an evaluation step. In this step, p parameters $(\hat{s},\hat{c})_p$ that are highly likely to correspond to p peaks of interest (true peaks) are fundamentally selected from the q estimated parameters. These are referred to as a string of selected parameters. Subsequently, the string of selected parameters is evaluated and an evaluation value J is calculated. If the number of selected parameters p' is less than p, p' parameters are evaluated in an exceptional manner, in which case the evaluation value J is highly likely to be low. Therefore, computation of the evaluation value may be omitted. The contents of the evaluation step are set forth in detail in the subroutine, which will be described in detail later.

At step S38, a decision is made as to whether q is less than $q_{max}$. If the decision is YES, control goes to step S39, where 1 is added to q and the sum is redefined to be q. The step S34 and the following steps are carried out repetitively. If the decision at step S38 is NO, step S40 is performed.

At step S40, the evaluation values J obtained at various values of the estimation order q within the range from the initial value $q_{start}$ to the maximum value $q_{max}$ are compared with each other, and an optimal evaluation value (degree of coincidence described later) is determined. An estimation order corresponding to the optimal evaluation value is the optimal estimation order. That is, in the present method, it is possible to search for an optimal estimation order by varying the estimation order in a trial-and-error manner. If the optimal estimation order is identified in this way, a corresponding string of selected parameters is identified. Based on the string of selected parameters, p intensities corresponding to p peaks of interest are estimated. Whenever each individual parameter is estimated, a selecting step (e.g., based on a selection region R described later) may be performed rather than the selecting step is performed after the completion of estimation of all the parameters.

A specific example of the evaluating step S36 is next described by referring to the subroutine shown in the right half of FIG. 3.

At step S42, p' parameters belonging to the selection region R are selected from among the parameter string consisting of q parameters, it being noted that p'≤q. In this case, the resonance frequencies w contained in the poles constituting the parameters are referenced. As a result of this first selection, signal components corresponding to peaks present outside the frequency range of interest are no longer evaluated. In other words, only one or plural parameters having resonance frequencies close to p true peaks are selected as subjects of evaluation. Consequently, the evaluation accuracy can be enhanced. At step S44, a decision is made as to whether p' is greater than p, i.e., whether abundant parameters capable of being removed by a second selection are contained. If the decision is YES, step S46 is performed to perform the second selection.

At the step S46, the most significant p parameters (e.g., having the p smallest linewidths (each linewidth being a peak width (half width at half maximum))) are selected from among the p' parameters judged to belong to the selection region R. That is, p parameters that are highly likely to be true peaks are selected from peaks which have been judged to belong to the selection region R. Because of this second selection, parameters closer to true peaks can be selected by mutual comparison. In this case, the selection efficiency can be enhanced further because the selection is made based on information regarding other than frequency that has been considered in the first selection step. Intensities other than linewidths may be referenced as selection criteria of the second selection. Furthermore, plural kinds of information such as linewidths, frequencies, and intensities may be referenced as selection criteria.

If the decision at the step S44 is that p' is equal to or less than p, then there is no need to make the second selection. Therefore, step S48 is immediately executed. The subroutine may be terminated without via the step S48.

At the step S48, a string of selected parameters given by $$(\hat{s}_k,\hat{c}_k)_{p \text{ or } p'}$$

and consisting in principle of p parameters or exceptionally of p' parameters selected in this way is evaluated. In particular, an evaluation signal given by $$h'(n) = \sum_{k=1}^{p} \hat{c}_k e^{n\hat{s}_k T_s} \quad (23)$$

is first formed using the string of selected parameters. Note that Eq. (23) is merely exemplary. Eq. (23) is based on the assumption that p parameters have been selected.

The evaluation value J is computed based on the following Eq. (24).

$$J = \sum_{n=0}^{N-1} |\bar{h}(n) - h'(n)|^2 \quad (24)$$

where $\bar{h}(n)$ is a time-domain FID signal obtained by an actual measurement. This FID signal is represented as by Eq. (20). The evaluation value J is found as the sum total (corresponding to error energy) of the absolute values of differences of amplitudes at sampling points, using Eq. (24). The evaluation value J is an amount for evaluating the degree of coincidence between the actual FID signal and the evaluation signal. If the true pole and intensity of the FID signal can be estimated at some value of the estimation order q, and if these can be selected in accordance with the aforementioned selection criteria, J is the energy of noise components.

A denominator term for normalization may be added to Eq. (24). The FID signal derived by an actual measurement does not vary irrespective of the estimation order q and so such normalization is not always needed in performing mutual comparison. It can be concluded that the estimation order q minimizing the evaluation value J, i.e., error energy, is the optimal estimation order.

Figure 4:
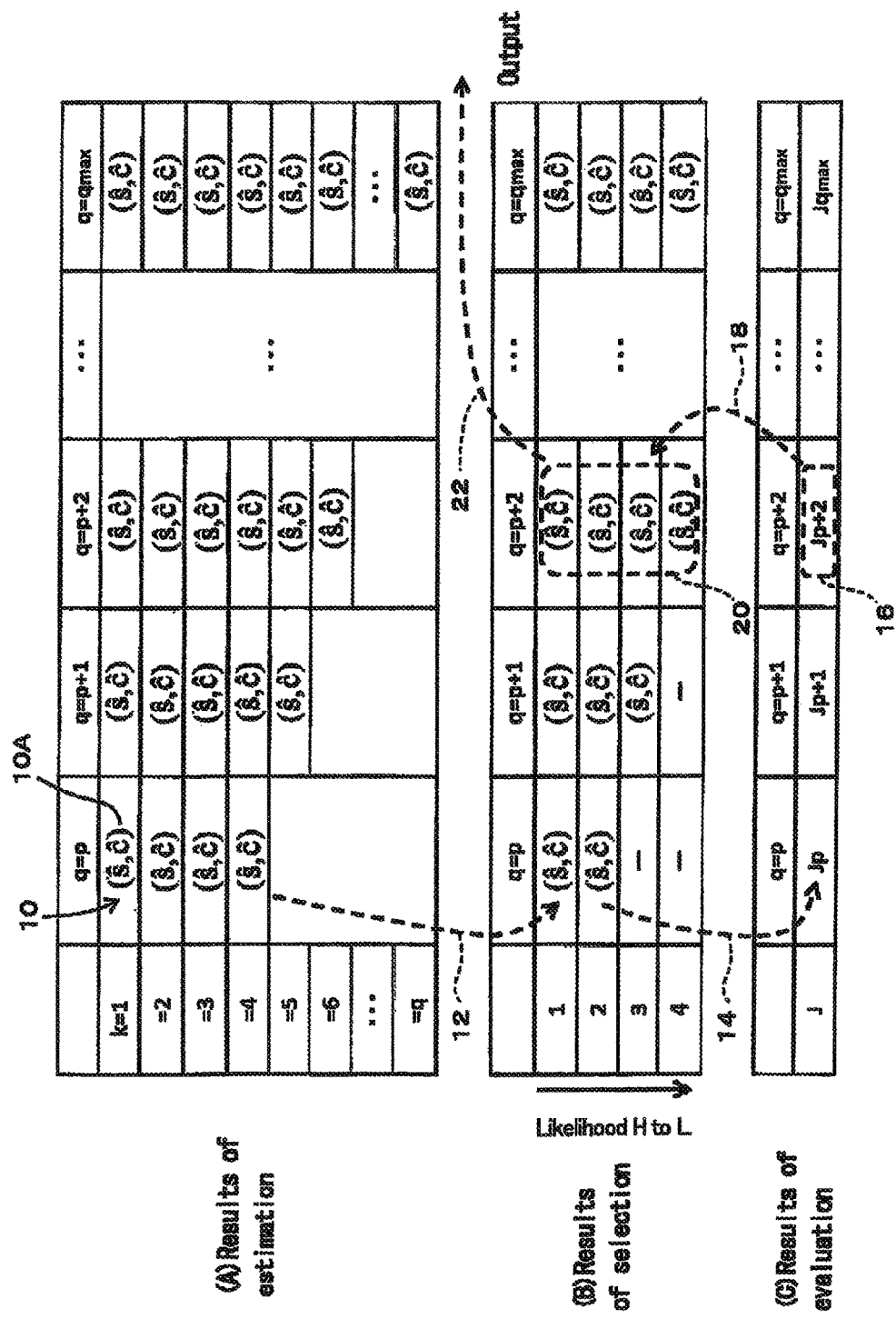
FIG. 4 is a conceptual diagram illustrating estimation results, selection results, and evaluation results produced concomitantly with execution of the parameter estimation method illustrated in FIG. 3.

FIG. 4 schematically shows the outcomes produced in a stepwise manner concomitantly with execution of the present method. As described previously, in the present embodiment, the constitution order p is assumed to be 4.

Diagram portion (A) of FIG. 4 shows the results of the execution of the estimation step S34, i.e., the results of estimation of parameters. The estimation order q is plotted on the horizontal axis. In the present embodiment, the estimation order q varies at increments of 1 from p to $q_{max}$. The incremental amount can be increased to reduce the amount of computation. Large and small incremental amounts may be used in combination. q parameters 10A are estimated for each value of the estimation order q. These constitute a parameter string 10. Therefore, if the estimation order is increased in turn, the number of estimated parameters is increased in turn. As described previously, the parameters 10A are a set of poles and complex intensities.

Diagram portion (B) of FIG. 4 shows the results of execution of the selection process consisting of the steps S42 and S46, i.e., the results of selections. In the present embodiment, fundamentally two stages of selecting steps are carried out. The first selecting step uses the selection region R. The second selecting step selects the most significant p parameters having the p smallest linewidths. The first selecting step performed on the parameter string 10 estimated for each value of the estimation order q is indicated by numeral 12. If 5 or more parameters are selected as a result of the first selecting step, the second selecting step is performed. In the illustrated example of (B), in a case where q is p and in another case where q is p+1, p' parameters (p' is less than p=4) are selected. In these cases, the second selecting step is not executed.

On the other hand, at each value of the estimation order q that is equal to or greater than p+2, the second selecting step is performed. Then, four parameters forming a string of selected parameters are selected in each case. That is, four parameters which are most likely to be true peaks are selected. The other parameters are discarded. In the second selecting step, rearrangement of the parameters within the string is fundamentally dispensed with.

Diagram portion (C) of FIG. 4 shows the results of execution of the evaluation value calculating step S48, i.e., the results of evaluation. As indicated by numeral 14, the evaluation value J is calculated based on a string of selected parameters at each value of the estimation order q. Then, an optimal evaluation value 16 is identified from among plural evaluation values. This is equivalent to determination of an optimal estimation order. Subsequently, as indicated by numeral 18, a string of selected parameters 20 corresponding to the optimal evaluation value 16 is identified. As indicated by numeral 22, the identified string of selected parameters is output or an intensity corresponding to the constitution order p calculated based on the string is output. If p' parameters or their intensity is identified, a notice to this effect may be given and the parameters or intensities may be output or an error notification may be issued. In the latter case, if the decision at step S44 is NO, an error may be recorded and computation of evaluation values may be omitted.

As described so far, a first feature of the present method is that estimation results are evaluated for each value of the estimation order q while varying the value of the estimation order q in a trial-and-error manner and an optimal estimation order is identified based on the evaluation results rather than the estimation order q is uniquely set in advance. Therefore, the estimation order used for computations in accordance with an FID signal can be selected adaptively. This prevents the problem of estimation accuracy deterioration due to inappropriate setting of the estimation order. That is, it is possible to overcome the problems that would be caused if the high-order Prony method is applied intact.

A second feature is that only good parameters selected from estimation results are evaluated rather than all estimation results are always evaluated in an evaluation process. Furthermore, final evaluation results are composed of good parameters selected. Therefore, if parameters deviating greatly from true values are being estimated and at the same time parameters close to true values are being estimated, then only the latter good parameters can be evaluated and adopted. That is, the present method is based on a high-order Prony method but different in that the same number of sets of estimation results as the constitution order (i.e., the number of peaks of interest) are selected, evaluated, and adopted.

(6) Verification of Method Associated with the Present Embodiment

To verify the effectiveness of the method associated with the present embodiment, two computer simulations and experiments using signals actually obtained were conducted.

In the first simulation, the present method was applied to a pseudo-FID signal similar to the signal shown in FIG. 2. It was examined how the evaluation value J varied with varying the value of the estimation order. Also, a distribution of optimal estimation order was found by repetitive application of the present method. In the second simulation, the present method was applied to a pseudo-FID signal derived by NMR spectroscopy from $^1$H within ethanol. The intensity of each atomic group such as a substituent group was estimated.

A first simulation is first described. The constitution order was set to 4. The selection region R was centered at the central frequency of a peak waveform of interest and set to extend 0.1 Hz above and below the center frequency. Under these conditions, an estimation model was employed and the intensity of each signal component constituting the pseudo-FID signal was found for each value of the estimation order. Their total was calculated. The processing described so far was attempted 100 times while varying the applied disturbance. As a result, the mean value of estimated intensities was 1.9997; the true value was 2. The standard deviation was 0.0156.

Figure 5:
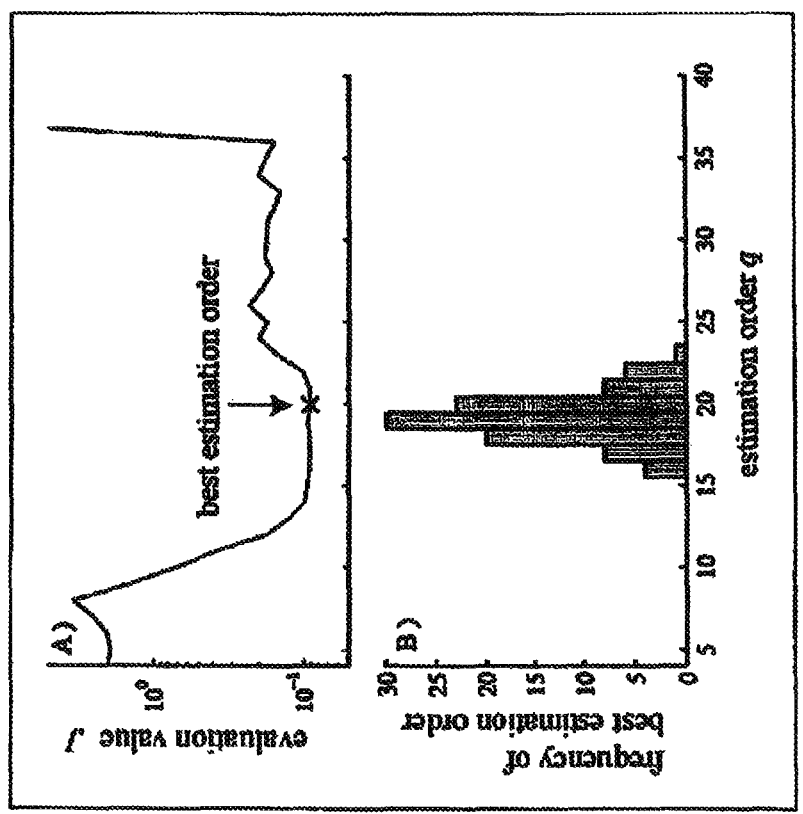
FIG. 5 is a graph showing variations in evaluation value produced concomitantly with variation of an estimation order and a frequency distribution of an optimal estimation order.

The results of the first simulation are shown in FIG. 5. The upper part of FIG. 5 shows variations of the evaluation value J caused concomitantly with variation of the estimation order. The lower part of FIG. 5 shows a distribution of frequencies of the optimal estimation order. It can be seen from FIG. 5 that J showed large values in a low order range and in a high order range where estimation accuracy was regarded as low and that optimal estimation orders were often determined around an estimation order q=19. As can be understood from the mean value and standard deviation of the distribution of frequencies of the optimal estimation order, use of the present method makes it possible to effectively circumvent deterioration of parameter estimation accuracy that would be caused when inappropriate estimation orders are set. That is, the intensity estimation accuracy can be improved.

attempted 100 times while varying the applied disturbance. The results are shown in Table 2. The upper part of Table 2 shows mean values and standard deviations of estimated intensities. The lower part of Table 2 shows mean values and standard deviations of estimated errors.

TABLE 2

| Group | S/N = 1000 | | S/N = 500 | | S/N = 200 | | S/N = 100 | | S/N = 50 | |
|---|---|---|---|---|---|---|---|---|---|---|
| | Mean | SD | Mean | SD | Mean | SD | Mean | SD | Mean | SD |
| Mean and SD (Standard Deviation) of Estimated Intensity of each group | | | | | | | | | | |
| OH | 0.995 | 1.5E−03 | 0.997 | 1.6E−03 | 1.000 | 5.5E−03 | 1.007 | 9.4E−03 | 1.051 | 2.1E−02 |
| $CH_2$ | 1.992 | 2.5E−03 | 1.990 | 4.3E−03 | 1.986 | 8.4E−03 | 1.995 | 1.8E−02 | 2.003 | 3.5E−02 |
| $CH_3$ | 2.997 | 2.0E−03 | 2.993 | 4.2E−03 | 2.993 | 8.1E−03 | 2.985 | 1.5E−02 | 3.001 | 2.9E−02 |
| Mean and SD of Estimated error of each group (%) | | | | | | | | | | |
| OH | 0529 | 0.152 | 0.285 | 0.164 | 0.007 | 0.551 | 0.657 | 0.937 | 5.055 | 2.077 |
| $CH_2$ | 0.417 | 0.127 | 0.517 | 0.214 | 0.624 | 0.420 | 0.274 | 0.901 | 0.138 | 1.735 |
| $CH_3$ | 0.101 | 0.067 | 0.240 | 0.140 | 0.232 | 0.270 | 0.507 | 0.492 | 0.049 | 0.976 |

Figure 6:
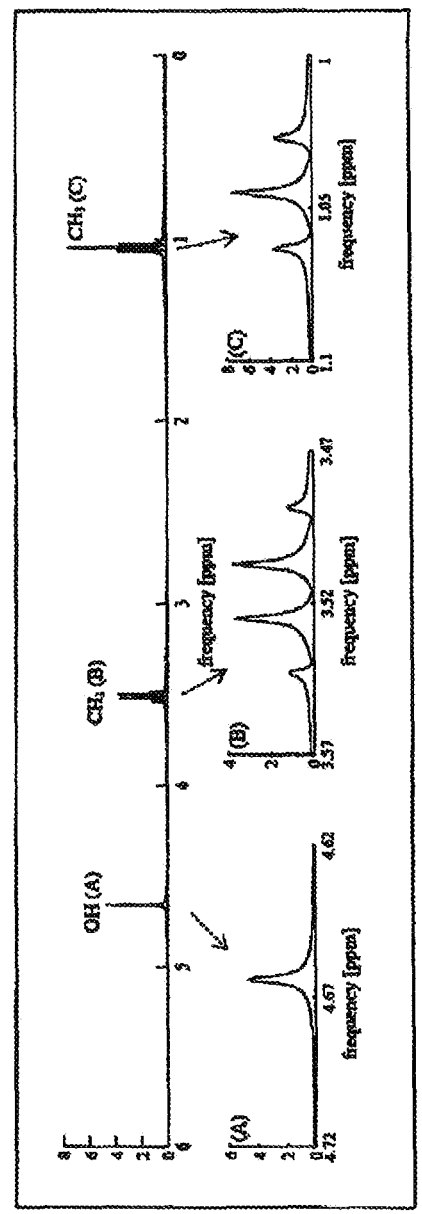
FIG. 6 shows NMR spectra produced based on pseudo-FID signals.

The second simulation is next described. The sampling frequency was set to 10 kHz. The resonance frequency of a nucleus under observation was set to 400 MHz. The center frequency under observation was set to 5 ppm. The number of data points was set to $2^{15}$. As shown in FIG. 6, a spectrum arising from a pseudo-FID signal contains three peak waveforms of interest, i.e., OH (peak waveform (A)), $CH_2$ (peak waveform (B)), and $CH_3$ (peak waveform (C)). A set of parameters which produced these peaks is listed in Table 1 below.

TABLE 1

| Group | $\omega_l$ [ppm] | $\sigma_l$ [ppm] | $c_l$ | $C_{group}$ |
|---|---|---|---|---|
| OH (A) | 4.664 | 8.0E−04 | 1 | 1 |
| $CH_2$ (B) | 3.543 | 8.0E−04 | 0.25 | 2 |
| | 3.525 | 8.0E−04 | 0.75 | |
| | 3.507 | 8.0E−04 | 0.75 | |
| | 3.489 | 8.0E−04 | 0.25 | |
| $CH_3$ (C) | 1.063 | 8.0E−04 | 0.75 | 3 |
| | 1.045 | 8.0E−04 | 1.5 | |
| | 1.027 | 8.0E−04 | 0.75 | |

In quantitative analysis of a compound, the intensity $C_{group}$ of each atomic group (such as a substituent group) is important rather than the intensity of each peak. Therefore, in the following, the accuracy at which the intensity $C_{group}$ of each atomic group is estimated is discussed.

The constitution order p was set to 1, 4, and 3, for OH (A), $CH_2$ (B), and $CH_3$ (C), respectively. The center frequency of a peak waveform for these atomic groups was set to 4.664, 3.516, and 1.045 ppm, respectively. The selection region R for them was centered at the center frequency of each peak waveform and set to extend 0.1 ppm above and below the center frequency. In order to reduce the computational time, signal extraction using a bandpass filter was performed as preprocessing. The passband of the filter was set to extend about 0.25 ppm above and below the center frequency of each atomic group. The filtering was conducted in the time domain.

Under the analysis conditions described above, the present method was applied to the pseudo-FID signal. The intensities of the same number of peaks as the constitution order were estimated. Their sum total was calculated as the intensity of each atomic group. An estimate of intensity was It can be confirmed from Table 2 that where the S/N is 100 or higher, the intensity of each atomic group can be estimated with an error not greater than 1%. That is, according to the present method, quantitative analysis accuracy having no practical problems can be obtained.

Figure 7:
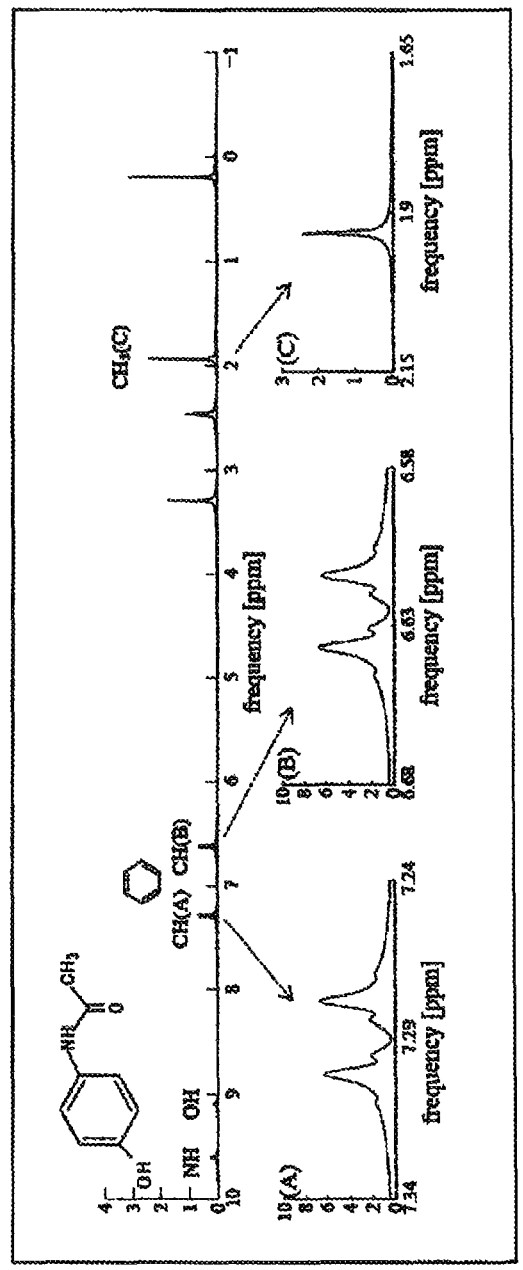
FIG. 7 shows NMR spectra produced based on FID signals derived by actual measurements.

Subsequently, an experiment was performed in which the present method was applied to an FID signal actually obtained by NMR from $^1H$ of acetoaminophene and the intramolecular integral ratio (intensity ratio) was estimated. Concomitantly, the conventional curve fitting method and integration method were applied to the same signal. The obtained estimation results were compared. Note that the present method was applied to time sequential data itself, i.e., FID signal. The conventional methods were applied to absorption spectra of the FID signal. The sampling frequency was 10.016 kHz. The resonance frequency of the nucleus under observation was 399.78 MHz. The center frequency under observation was 5 ppm. The number of data points was $2^{15}$. The number of accumulations was 8. FIG. 7 shows an FFT spectrum of the above-described FID signal obtained by an actual measurement.

The analysis conditions were as follows. In the present method, the constitution order p was set to 6, 6, and 1 for CH (A), $CH_2$ (B), and $CH_3$ (C), respectively. The center frequencies of these atomic groups were 7.295, 6.63, and 1.936 ppm, respectively. Selection regions for these atomic groups were centered at their respective center frequencies and set to extend 0.025, 0.05, and 0.1 ppm, respectively, above and below the respective center frequency. Signal extraction was performed as preprocessing for each atomic group within a range extending about 0.25 ppm above and below the center frequency. The first 21 points of the data points underwent delay from a digital filter for down-sampling and so the 22nd and following data points were used for analysis.

For reference, the analysis conditions for the curve fitting method are described. The initial parameters are listed in the following Table 3.

TABLE 3

| | Condition 1 | | | | Condition 2 | | |
|---|---|---|---|---|---|---|---|
| Group | $\omega_{l,o}$ [ppm] | $\sigma_{l,o}$ [ppm] | $C_{l,o}$ | Group | $\omega_{l,o}$ [ppm] | $\sigma_{l,o}$ [ppm] | $C_{l,o}$ |
| CH (A) | 7.308 | 1.83E−03 | 7.35E−05 | CH (A) | 7.308 | 1.43E−03 | 2.44E−03 |
| | 7.300 | 1.53E−03 | 6.50E−04 | | 7.300 | 1.43E−03 | 2.44E−03 |
| | 7.295 | 1.83E−03 | 2.52E−04 | | 7.295 | 1.43E−03 | 2.44E−03 |
| | 7.283 | 1.81E−03 | 2.49E−04 | | 7.283 | 1.43E−03 | 2.44E−03 |
| | 7.278 | 1.53E−03 | 7.05E−04 | | 7.278 | 1.43E−03 | 2.44E−03 |
| | 7.269 | 1.91E−03 | 8.88E−05 | | 7.269 | 1.43E−03 | 2.44E−03 |
| CH$_2$ (B) | 6.644 | 1.99E−03 | 9.04E−05 | CH$_2$ (B) | 6.644 | 1.43E−03 | 2.44E−03 |
| | 6.635 | 1.53E−03 | 7.13E−04 | | 6.635 | 143E−03 | 2.44E−03 |
| | 6.631 | 1.61E−03 | 2.31E−04 | | 6.631 | 143E−03 | 2.44E−03 |
| | 6.619 | 1.68E−03 | 2.26E−04 | | 6.619 | 143E−03 | 2.44E−03 |
| | 6.614 | 1.45E−03 | 6.40E−04 | | 6.614 | 143E−03 | 2.44E−03 |
| | 6.605 | 1.68E−03 | 7.06E−05 | | 6.605 | 143E−03 | 2.44E−03 |
| CH$_3$ (C) | 1.932 | 1.43E−03 | 2.44E−03 | CH$_3$ (C) | 1.932 | 1.43E−03 | 2.44E−03 |

In condition 1 on the left side, the frequencies of peaks were first found from an absorption spectrum. Then, linewidths and intensities were found in turn. These were treated as initial parameters. In condition 2 on the left side, the same values of frequency were used as in condition 1. With respect to linewidth and intensity, the conditions shown at the lowest part of condition 1, i.e., 1.43E-03 and 2.44E-03, were applied to all the peaks. These were treated as initial parameters. A range in which parameters were optimized was centered at the center frequency of each atomic group and set to extend about 0.05 ppm above and below the center frequency.

In the integration method, an integral range was set such that it was based on both ends (linewidth) of a peak waveform of each atomic group, centered at the center frequency of the peak waveform, and became 32 times and 64 times the linewidth. Values put in condition 1 of Table 3 were used as the values of linewidth and frequency.

Estimation results obtained by the present method (proposal method), curve fitting method, and integration method are shown in the following Table 4. In applying these methods, it was assumed that the intensity ratio between CH and CH$_3$ was 2:3. The intensity of CH$_3$ (C) (see FIG. 7) was set to 3. The intensities of CH (A) (see FIG. 7) and CH$_2$ (B) relative to that intensity were estimated.

TABLE 4

| | Proposal method | | | Curve fitting method condition | | Integration method | |
|---|---|---|---|---|---|---|---|
| Group | ±0.025 | ±0.05 | ±0.1 | 1 | condition 2 | 32 | 64 |
| | Estimated Intensity (ratio) | | | | | | |
| CH (A) | 2.012 | 2.012 | 2.012 | 2.362 | 2.111 | 2.008 | 1.992 |
| CH$_2$ (B) | 2.002 | 2.002 | 2.002 | 2.320 | 2.090 | 2.024 | 2.009 |
| | Estimated Error of Intensity [%] | | | | | | |
| CH (A) | 0.600 | 0.600 | 0.600 | 18.123 | 5.570 | 0.380 | 0.388 |
| CH$_2$ (B) | 0.096 | 0.096 | 0.096 | 15.993 | 4.462 | 1.174 | 0.465 |

Estimation intensities are shown in the upper section of Table 4. Estimation errors are shown in the lower section of Table 4. As can be seen from Table 4, the curve fitting method suffered from the greatest estimation errors. Under conditions 1 and 2, errors of more than 10% and more than 4%, respectively, occurred. Furthermore, in the curve fitting method, a difference on the order of 10% was observed between the results produced under condition 1 and the results produced under condition 2. Therefore, it can be confirmed that the curve fitting method depends greatly on initial values. In the integration method, intensities were estimated with errors of less than 1% in cases where the integral range was 64 times as large as the linewidth. However, where the integral range was 32 times as large as the linewidth, errors exceeding 1% occurred. This shows that the estimation accuracy of the integration method depends greatly on the integral range.

On the other hand, in the present method, intensities could be estimated with errors of less than 1% and thus the present method is sufficiently applicable to quantitative analysis. Furthermore, the present method has the advantage that the intensities of FID signals can be estimated without phase correction, which would have been required heretofore. From these respects, it can be said that the present method is a more objective technique than the two conventional methods.

Furthermore, it can be seen from Table 4 that differences in size of selection range do not affect the estimation accuracy. Although it may not be concluded that similar results have been obtained from other experimental data, the selection range is intended to permit an appropriate selection of a parameter string and so the requirement is only that the selection range is so set as to permit an appropriate selection. Therefore, the selection range does not need to be set strictly. The selection range may be set somewhat broadly so as to include peaks of interest.

(7) NMR Signal Processing System Associated with the Present Embodiment

Figure 8:
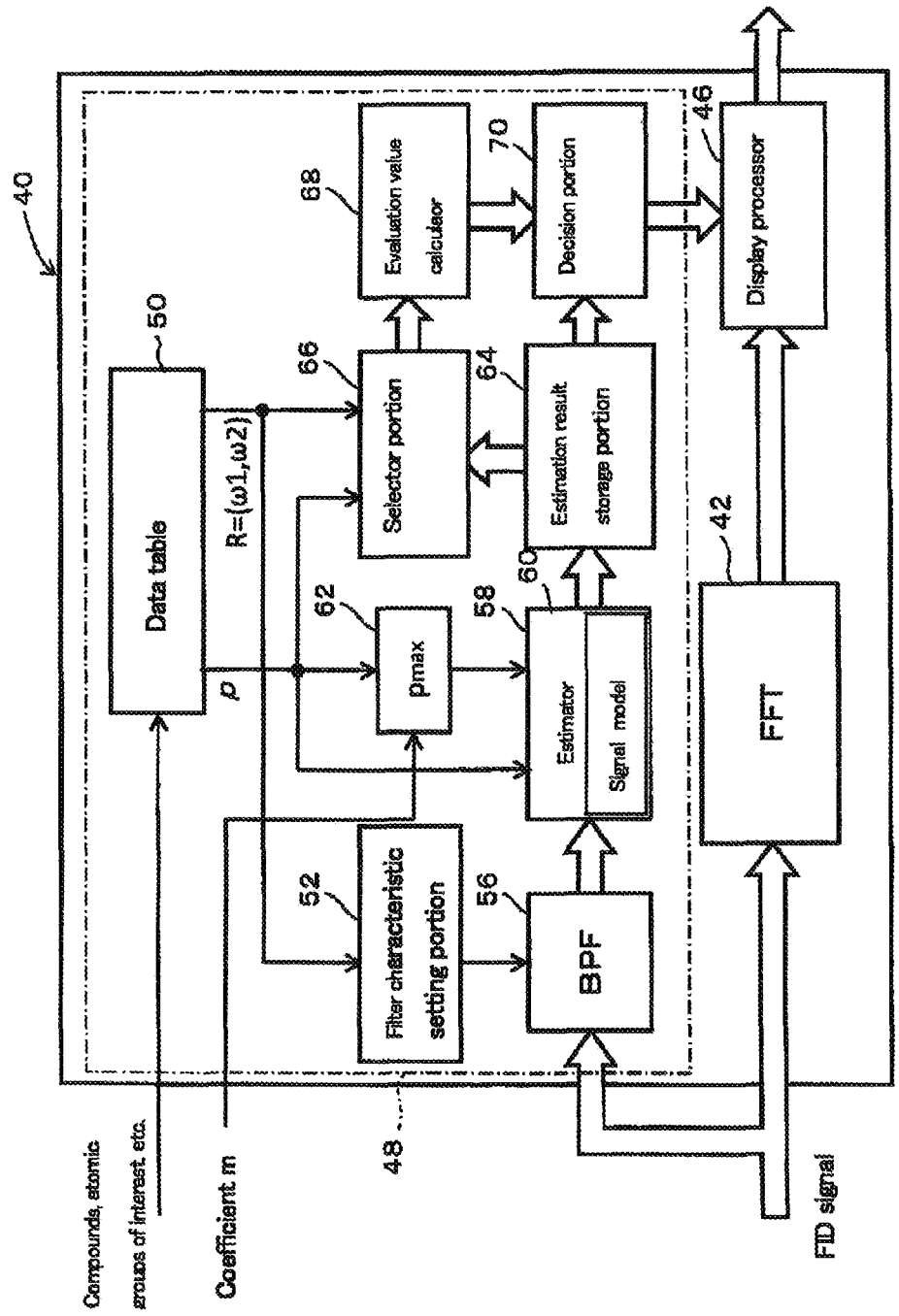
FIG. 8 is a block diagram showing a preferred embodiment of the NMR signal processing system associated with the present invention.

An NMR signal processing system associated with the present embodiment is shown in block diagram form in FIG. 8. This system is incorporated in a part of an NMR measuring system or constituted as a stand-alone information processor. Various functions illustrated in FIG. 8 are implemented fundamentally by software processes. All or some of the functions may be carried out by a dedicated hardware module.

Referring to FIG. 8, the NMR signal processing system is generally indicated by reference numeral 40 and processes an FID (free induction decay) signal obtained as a receive signal by an NMR measurement. For example, the processing system 40 is made of a personal computer. Generally, the FID signal is a complex signal (digital signal) produced after quadrature detection. The system 40 includes an FFT (fast Fourier transform) processor 42 that creates a spectrum by processing the FID signal by FFT in the same manner as in the prior art. Data representing the spectrum is sent to a display portion (not shown) via a display processor 46.

The NMR signal processing system 40 further includes a parameter estimating module 48 for implementing the method associated with the present embodiment. The estimating module 48 calculates the intensity of each peak of interest based on the high-order Prony method involving a selection reconstitution evaluation method, on the assumption that the compound of interest is known, i.e., the number of peaks of interest is known.

The parameter estimating module 48 is described in further detail. This module 48 includes a bandpass filter (BPF) 56 that extracts frequency components in a certain band from the FID signal, the band containing peaks of interest. The band is wider than a selection range described later and contains this selection range. In order to reduce the amount of computation, the BPF 56 is mounted as a preprocessor according to the need. The frequency characteristics of the BPF 56, i.e., the center frequency and bandwidth of the passband, are determined by a filter characteristic setting portion 52. In the illustrative embodiment, the filter characteristic setting portion 52 determines the filter characteristics based on frequencies $\omega_1$ and $\omega_2$ determining both ends of the selection region R.

An estimator 58 is a unit for implementing the high-order Prony method. That is, the estimator calculates q parameters (each being a combination of a pole and a complex intensity) at each value of the estimation order q, based on a signal model. In the illustrated example, the estimation order q is varied in increments of 1 from initial value p to maximum value $q_{max}$. Computations for estimating a parameter string are carried out at each value of the estimation order. The computations for estimation are based on the above-described mathematical signal model of a signal, 60. In this example, a calculator 62 calculates and sets m×p as an upper limit by multiplying a coefficient m, which is specified by a user or automatically determined, by the constitution order p. For example, the coefficient m is set to 10.

An estimation result storage portion 64 is made of a memory. A parameter string calculated at each value of the estimation order q is stored in the storage portion 64 (see (A) of FIG. 4). Each parameter string consists of q parameters.

A selector portion 66 performs the above-described two selecting steps in evaluating the estimation results. In particular, parameters satisfying conditions (i.e., resonance frequencies belong to the selection region R) are selected from among the q parameters estimated for each value of the estimation order q. These constitute strings of selected parameters. Then, when the number of parameters constituting the strings of selected parameters is greater than p, the selector portion 66 extracts the most significant p parameter strings which are most likely to be true peaks from among the strings of selected parameters and constitutes a string of selected parameters. As a result, p parameters are fundamentally selected for each value of the estimation order q and subjected to evaluation (see (B) of FIG. 4). However, parameters which are less than p in number may be selected in an exceptional manner. The results of selection are stored in a storage unit (not shown) or information indicative of the results of selection is stored in the storage portion 64.

An evaluation value calculator 68 calculates an evaluation value by introducing each string of selected parameters into Eq. (24) for each value of the estimation order q (see (C) of FIG. 4). The calculated evaluation values indicate the possibilities that the strings of selected parameters calculated for each value of the estimation order q represent peaks of interest, and are stored in a storage portion (not shown). Various mathematical formulas can be used as long as such evaluation values can be computed. A decision portion 70 determines an optimal evaluation value from plural evaluation values obtained by varying the estimation order q from its initial value to its maximum value. At the same time, an optimal estimation order is determined. The decision portion 70 extracts an optimal string of selected parameters corresponding to the optimal evaluation value (i.e., optimal estimation order) from the estimation result storage portion 64 and outputs the extracted string to the display processor 46. In principle, the optimal string of selected parameters consists of the same number of parameters as the constitution order p. Each parameter is a combination of a pole and a complex intensity. Consequently, p complex intensities are identified in principle. This, in turn, permits identification of p intensities. Where the optimal string of selected parameters consists of parameters whose number is less than p in an exceptional manner, the same number of intensities as the parameters are found. Even in this case, resonance frequencies can be identified from poles and, therefore, it is possible to find a corresponding relationship between the found intensities and peaks of interest.

The display processor 46 creates an estimation result image indicative of the parameter string, intensities, and so on found this way and sends the image to a display portion (not shown). In this case, information for identifying peaks of interest and estimated intensities of the peaks are preferably displayed while being interrelated to each other. In this case, an unestimated spectrum (hereinafter may be referred to as the actual spectrum) generated by the FFT processor 42 may be displayed at the same time. An estimated FID signal simulating an FID signal obtained by an actual measurement may be created by introducing the estimated string of parameters into an FID signal model. The waveform or its estimated spectrum may be displayed. In the latter case, if the actual spectrum and the estimated spectrum are displayed at the same time, the correctness of the computational estimation can be visually confirmed.

A data table 50 used for setting purposes is provided according to the need. This data table is organized in a storage portion. In the data table 50, subjects of estimation (such as compounds and atomic groups of interest) and corresponding sets of initial values are interrelated. If any subject of estimation is specified, a set of initial values corresponding to the specified subject of estimation is read from the data table 50. The set of initial values includes the constitution order p and information, $\omega_1$ and $\omega_2$, for identifying the lower and upper limits, respectively, of the selection region R. Furthermore, the coefficient m may be identified. Of course, these initial values may be set by the user or computed based on a given functional formula. Preferably, the system is so configured that qNMR is performed conveniently.

In the above embodiment, the number of peaks of interest, i.e., the constitution order, is known. A modified embodiment in which the number of peaks of interest, i.e., the constitution order, is not identified is also conceivable. For example, the present method may be repetitively applied at each different number of peaks of interest while varying the number of peaks of interest in a trial-and-error manner. Furthermore, in the above embodiment, information about the center frequency of each peak of interest is not actively employed. A further modified embodiment in which estimated center frequencies are compared against previously identified center frequencies is conceivable. Such comparisons may be introduced in computations of evaluation values.

Figure 9:
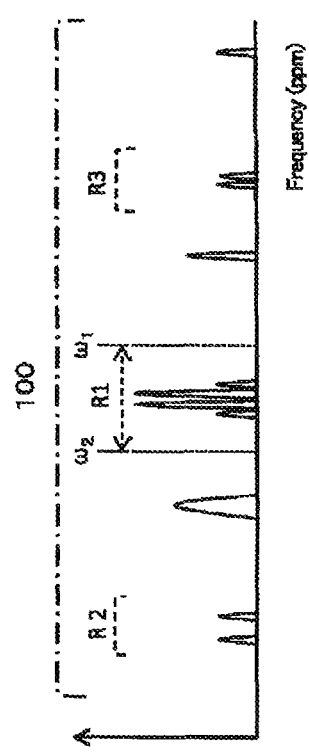
FIG. 9 is a chart illustrating a first example of how a selection area is set.
Figure 10:
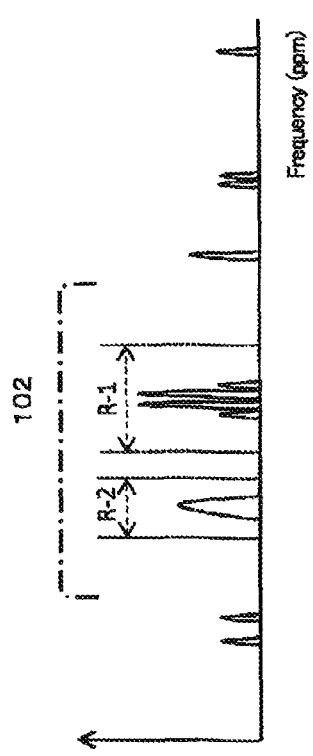
FIG. 10 is a chart illustrating a second example of how a selection area is set.

FIGS. 9 and 10 show spectra of FID signals. Examples of how a selection region is set are shown. In the first example shown in FIG. 9, a selection region R1 is set to embrace the waveforms of peaks of interest. By performing a selecting step using the selection range R1, the waveforms of peaks not of interest or disturbing peak waveforms can be removed from the subject of estimation or evaluation, thereby enhancing the accuracy at which peaks waveforms of interest are estimated. Two selection regions R2 and R3 are set in addition to the selection region R1. As the waveforms of peaks of interest are selected in turn, selection regions for them are selected in turn. Each of the three selection regions R1, R2, and R3 is fully contained in the passband 100 of the bandpass filter (BPF).

In the second example shown in FIG. 10, two subregions R-1 and R-2 are set. Each of the subregions contains one or plural peaks of interest. The peaks form a single selection region R as a whole. The passband 102 of the bandpass filter (BPF) is so set as to contain the two subregions R-1 and R-2. In this second example, the intensities of plural peaks of interest in each of the two subregions R-1 and R-2 spaced from each other can be estimated in one computational operation. In other words, those portions of a constant selection range which should not be estimated or evaluated can be excluded from the subject of computation. For example, where there are disturbing peaks, they can be excluded from the subject of estimation and evaluation.

As described so far, according to the present embodiment, especially in qNMR, the intensities of peaks of interest can be estimated accurately. In the conventional integration method, integral ranges have been set with difficulty. When the method of the present embodiment is used, such problems do not occur. Furthermore, the problem of the dependence on initial parameters as encountered in the conventional curve fitting does not take place. Consequently, a more objective technique can be offered.

(8) Other Evaluation Method

When Eq. (24) above is used, evaluation values are computed based on a time-domain FID signal obtained by an actual measurement and on a reconstructed signal. Alternatively, evaluation values may be calculated based on a frequency-domain FID signal obtained by an actual measurement and on a reconstructed signal. That is, a frequency-domain FID signal and a frequency-domain reconstructed signal can be obtained by taking Fourier transform of a time-domain FID signal and a time-domain reconstructed signal. An evaluation value can be found from their residual errors. The Fourier-transformed, frequency-domain FID signal and reconstructed signal are respectively given by $\overline{H}(\omega_n)$ and $H'(\omega_n)$, where n=0, 1, N−1. If $f_s$ is a sampling frequency, each sampling point $\omega_n$ in the frequency domain is given by $$\omega_n = 2\pi\left(-\frac{1}{2} + \frac{1}{N}n\right)f_s; n = 0, \cdots, N-1$$

Based on this, the evaluation value J in the frequency domain is defined, for example, as follows.

$$J = \sum_{n=0}^{N-1} |\overline{H}(\omega_n) - H'(\omega_n)|^2 \quad (25)$$

The residual energy between two signals is essentially the same whether in the time domain or in the frequency domain. Therefore, the evaluation value defined by Eq. (24) is equivalent to the evaluation value defined by Eq. (25). Evaluation values in the frequency domain function advantageously in a case where it is desired to make evaluation only within a local region rather than over the whole band. Such evaluation is difficult to make in the time domain. In the frequency domain, a frequency range where evaluation is made is specified. Then, an evaluation amount in the frequency domain is defined from a spectrum within this range as follows:

$$J = \sum_{n=0}^{N-1} |\overline{H}(\omega_n) - H'(\omega_n)|^2; \omega_a \leq \omega_n \leq \omega_b \quad (26)$$

where $\omega_a$ and $\omega_b$ are the lower and upper limits, respectively, of the evaluation range. The use of Eq. (26) permits evaluation within a local range. Such an evaluation method is especially effective in a case where other signal components are contained in a frequency range under observation.

Figure 11:
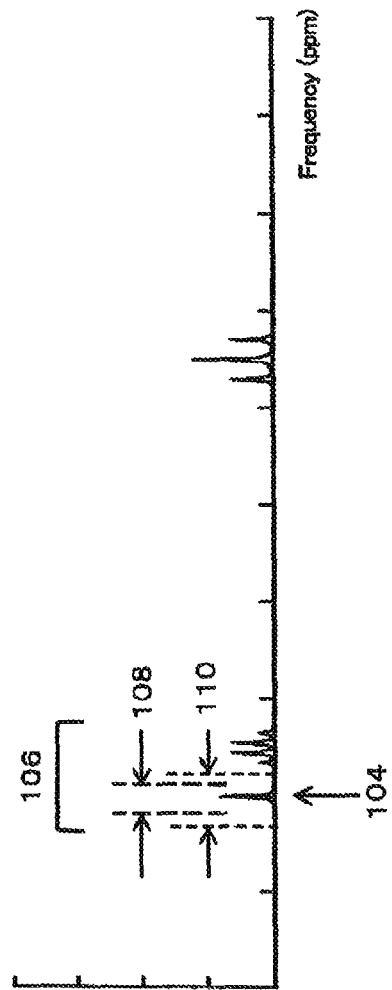
FIG. 11 is a chart illustrating an evaluation range.

This is further described by referring to FIG. 11, which shows a spectrum of an FID signal consisting of 8 signal components (i.e., p=8). A spectrum (not shown) of a similar FID signal obtained by an actual measurement is generated separately. Indicated by 104 is a peak of interest. The passband 106 of a filter is so set that the peak 104 of interest is contained in the passband 106. A selection range 108 is set around the peak of interest 104. An evaluation range 110 is set around the peak of interest. With respect to both actual FID signal and reconstructed signal, only frequency components contained in the evaluation range 110 are used for computations of evaluation values. The other frequency components are not used for this purpose.

In this way, computations of evaluation values using Eq. (26) above make it possible to make evaluations only within a desired frequency range for evaluation. Therefore, the effects of other signal components can be effectively eliminated or alleviated. Hence, the evaluation accuracy can be enhanced. It is quite difficult to place limitations on the range in a similar way as the foregoing using setting of the passband 106 of the filter (especially, to remove other signal components close to peaks of interest). However, this can be easily done if processing is performed in the frequency domain. In the example shown in FIG. 11, the selection range 108 and the evaluation range 110 are set separately. Both ranges can be brought into coincidence.

Having thus described our invention with the detail and particularity required by the Patent Laws, what is desired protected by Letters Patent is set forth in the following claims.

The invention claimed is:

1. A quantitative NMR system for finding the amount or concentration of a substance contained in a sample based on the amplitudes of p peaks originated from the substance appearing at known different positions in an NMR spectrum which is obtained by Fourier transformation of an FID (free induction decay) signal obtained by an NMR measurement, said quantitative NMR system comprising:
estimation means for obtaining estimation results by applying a mathematical model, (Equation (1)) which represents an FID (free induction decay) signal as a sum of q (q>p) signal components (exponentially decaying sinusoidal waves) that correspond to q peaks appearing in the NMR spectrum, to the FID signal obtained by an NMR measurement and producing the estimation results, each of the estimation results including q estimated parameters defining the q signal components, the estimation means being operative to obtain the estimation results by providing estimates at different values of q while varying the value of q from $q_{start}$ to $q_{max}$ by plural steps;

selection means having a function of selecting p parameters from among the q parameters included in each of the estimation results produced for each value of q in accordance with a first set of selection criteria regarding frequency band established so that all the p peaks of interest are contained in the frequency band;

evaluation means having a function of calculating an evaluation value about each of the estimation results produced by the estimation means for each value of q, based on the p parameters selected by the selection means for evaluating the estimation results produced by the estimation means for each value of q, said calculation of the evaluation value for each of the estimation results including reconstitution calculation of reconstructed signal based on the selected p parameters (Equation (23)) and calculation of the evaluation value (J) based on the difference between the reconstructed signal and the FID signal obtained by the NMR measurement (Equation (24));

decision means for determining an optimal value of q based on each of the evaluation values of the evaluation results produced by the evaluation means for each value of q to thereby identify plural parameters corresponding to the optimal value of q from among the estimation results produced by the estimation means; and means for finding the amplitudes of p peaks of interest based on the p parameters identified by the decision means.

2. The quantitative NMR system as set forth in claim 1, wherein said selection criteria include a second set of selection criteria for selecting the most significant p parameters which are most likely to represent true peaks, and wherein said selection means includes second selection means for selecting the most significant p parameters in accordance with said second set of selection criteria from among the plural parameters satisfying said first set of selection criteria selected by said first selection means.

3. The quantitative NMR system as set forth in claim 2, wherein said most significant p parameters which are selected in accordance with said second set of selection criteria and are most likely to represent true peaks represent the narrowest peaks in the frequency domain.

4. The quantitative NMR system as set forth in claim 1, wherein said q has a variable range of value whose lower limit is p and whose upper limit is set based on p.

5. The quantitative NMR system as set forth in claim 1, wherein said evaluation means calculates evaluation values by comparing said FID signal against a synthesized signal produced by giving said estimated p parameters to said mathematical model.

6. A computer program on a computer readable storage for use in a computer having an operating system and operated in a quantitative NMR system for finding the amount or concentration of a substance contained in a sample based on the amplitudes of p peaks originated from the substance appearing at known different positions in an NMR spectrum which is obtained by Fourier transformation of an FID (free induction decay) signal obtained by an NMR measurement, the computer program comprising code for implementing the functions of:

preparing a mathematical model that represents a free induction decay (FID) signal obtained by an NMR measurement as a sum of q signal components;

applying the mathematical model to the FID signal to obtain estimation results including q estimated parameters defining the q signal components;

varying the value of q from $q_{start}$ to $q_{max}$ by plural steps, providing estimates at different values of q, producing estimation results, and storing the estimation results in a first storage portion;

selecting p parameters from among the q parameters included in each of the estimation results produced for each value of q in accordance with a first set of selection criteria regarding frequency band established so that all the p peaks of interest are contained in the frequency band;

calculating an evaluation value about each of the estimation results for each value of q, based on the p parameters selected in the selection step and storing the evaluation values for each of the estimation results in a second storage portion, said calculation of reconstructed signal (Equation 23) and calculation of the evaluation value (J) based on the difference of the reconstructed signal (Equation (24)), determining an optimal value of q based on the evaluation results obtained for each value of q and stored in the second storage portion to thereby identify plural parameters corresponding to the optimal value of q from among the estimation results stored in the first storage portion; and finding the amplitudes of p peaks of interest based on the identified p parameters corresponding to the optimal value of q.

7. A quantitative NMR method for finding the amount or concentration of a substance contained in a sample based on the amplitudes of p peaks originated from the substance appearing at known different positions in an NMR spectrum which is obtained by Fourier transformation of an FID (free induction decay) signal obtained by an NMR measurement, said quantitative NMR method comprising the steps of:

preprocessing the FID signal by bandpass filtering the FID signal to extract frequency components in a certain band from the FID signal, said band containing the p peaks of interest;

preparing a mathematical model that represents an FID signal as a sum of q (q>p) signal components (exponentially decaying sinusoidal waves) that correspond to q peaks appearing in the NMR spectrum;

applying the mathematical model to the FID signal obtained by an NMR measurement and estimating q parameters defining the q signal components to obtain estimation results;

repeating the estimating step for different values of q;

evaluating the estimation results produced at the various values of q and obtaining evaluation values by calculating an evaluation value about each of the estimation results produced for each value of q, based on p parameters, said calculation of the evaluation value for each of the estimation results including reconstitution calculation of the reconstructed signal based on the selected p parameters (Equation (23)) and calculation of the evaluation value (J) based on the difference between the reconstructed signal and the FID signal obtained by the NMR measurement (Equation (24));

determining an optimal value of q with the highest evaluation based on the evaluation values obtained at the various values of q, selecting p parameters corresponding to the optimal value of q determined from the estimation results produced by the estimating step;

finding the amplitudes of p peaks of interest based on the p parameters identified; and finding the amplitudes of p peaks of interest based on the identified p parameters corresponding to the optimal value of q.

8. A quantitative NMR method for finding the amount or concentration of a substance contained in a sample based on the amplitudes of p peaks originated from the substance appearing at known different positions in an NMR spectrum which is obtained by Fourier transformation of an FID (free induction decay) signal obtained by an NMR measurement, said quantitative NMR method comprising the steps of:

preparing a mathematical model that represents an FID signal as a sum of q (q>p) signal components (exponentially decaying sinusoidal waves) that correspond to q peaks appearing in the NMR spectrum;

applying the mathematical model to the FID signal obtained by an NMR measurement, estimating q parameters defining the q signal components to obtain estimation results, and storing the estimation results in a first storage portion;

storing the estimation results in a first storage portion;

evaluating the estimation results stored in the first storage portion and storing obtained evaluation results in a second storage portion;

repeating the estimating step and evaluating step for different values of q;

determining an optimal value of q with the highest evaluation based on the evaluation results produced at the various values of q and stored in the second storage portion, selecting plural parameters corresponding to the determined optimal value of q determined from among the estimation results stored in the first storage portion; and finding the amplitudes of p peaks of interest based on the identified p parameters corresponding to the optimal value of q.

9. A quantitative NMR system for finding amount or concentration of a substance contained in a sample based on the amplitudes of p peaks originated from the substance appearing at known different positions in an NMR spectrum which is obtained by Fourier transformation of an FID (free induction decay) signal obtained by an NMR measurement, said quantitative NMR system comprising:

a computer programmed with an estimation means for applying a mathematical model, which represents an FID (free induction decay) signal as a sum of q signal components, to the FID signal obtained by an NMR measurement and estimating plural parameters defining the q signal components, the estimation means being operative to obtain estimation results by providing estimations for different values of q while varying the value of q among different levels;

a first storage portion for storing the estimation results obtained by the estimation means for the plural values of q;

said computer programmed with evaluation means for evaluating each set of the estimation results produced for each value of q and stored in the first storage portion said calculation of the evaluation value for each of the estimation results including reconstitution calculation of reconstructed signal based on the selected p parameters (Equation (23)) and calculation of the evaluation value (J) based on the difference between the reconstructed signal and the FID signal obtained by the NMR measurement (Equation (24);

said computer programmed with decision means for determining an optimal value of q with the highest evaluation based on the evaluation results produced by the evaluation means for each value of q, and finding the amplitudes of p peaks of interest based on the identified p parameters corresponding to the optimal value of q.

* * * * *